US011914297B2

(12) United States Patent
Oya et al.

(10) Patent No.: US 11,914,297 B2
(45) Date of Patent: Feb. 27, 2024

(54) POLYETHYLENE FILM AND DRY FILM RESIST

(71) Applicant: TAMAPOLY CO., LTD., Tokyo (JP)

(72) Inventors: Shinichi Oya, Tokyo (JP); Toshiaki Hagiwara, Tokyo (JP); Hitoshi Nakamura, Tokyo (JP)

(73) Assignee: TAMAPOLY CO., LTD., Tokyo (JP)

( * ) Notice: Subject to any disclaimer, the term of this patent is extended or adjusted under 35 U.S.C. 154(b) by 645 days.

(21) Appl. No.: 17/251,265

(22) PCT Filed: Jun. 17, 2019

(86) PCT No.: PCT/JP2019/023868
§ 371 (c)(1),
(2) Date: Dec. 11, 2020

(87) PCT Pub. No.: WO2020/255194
PCT Pub. Date: Dec. 24, 2020

(65) Prior Publication Data
US 2021/0271167 A1    Sep. 2, 2021

(51) Int. Cl.
*G03F 7/11* (2006.01)
*B32B 27/08* (2006.01)
*B32B 27/32* (2006.01)
*C08J 5/18* (2006.01)
*C08L 23/06* (2006.01)
*G03F 7/09* (2006.01)

(52) U.S. Cl.
CPC ............ *G03F 7/11* (2013.01); *B32B 27/08* (2013.01); *B32B 27/32* (2013.01); *C08J 5/18* (2013.01); *C08L 23/06* (2013.01); *G03F 7/094* (2013.01); *B32B 2255/10* (2013.01); *B32B 2307/20* (2013.01); *C08J 2423/06* (2013.01); *C08L 2203/16* (2013.01); *C08L 2207/066* (2013.01)

(58) Field of Classification Search
CPC ........ G03F 7/11; C08L 23/06; C08L 2203/16; B32B 27/08; B32B 27/32; B32B 2323/04; B32B 2323/046
See application file for complete search history.

(56) References Cited

U.S. PATENT DOCUMENTS

| 5,017,429 A | * | 5/1991 | Akao | ............... B32B 15/08 428/458 |
| 6,664,346 B2 | | 12/2003 | Tsutsumi et al. | |
| 7,166,178 B2 | | 1/2007 | Tsutsumi et al. | |
| 2002/0146582 A1 | * | 10/2002 | Tsutsumi | ............... C08J 5/18 526/83 |
| 2003/0207139 A1 | | 11/2003 | Tsutsumi et al. | |
| 2011/0281067 A1 | * | 11/2011 | Yoshida | ............... C09J 123/0861 428/141 |
| 2012/0130019 A1 | * | 5/2012 | Karjala | ............... C08F 210/16 525/240 |

FOREIGN PATENT DOCUMENTS

| JP | 2000273203 A | 10/2000 | |
| JP | 2002060426 A | 2/2002 | |
| JP | 2003231759 A | 8/2003 | |
| JP | 2012208528 A | 10/2012 | |
| JP | 6068463 B | 1/2017 | |
| TW | 581933 B | 4/2004 | |
| TW | 201438901 A | 10/2014 | |
| WO | WO-2013009511 A1 | 1/2013 | |
| WO | WO-2014091808 A1 * | 6/2014 | ............ B32B 27/08 |

OTHER PUBLICATIONS

English translation of WO2014091808. (Year: 2014).*
Combined Office Action and Search Report dated May 17, 2021 in Taiwanese Patent Application No. 109120024 (with English translation), 8 pages.
Office Action dated May 18, 2021 in Japanese Patent Application No. 2020-522402 (with English translation), 6 pages.
Opinion submission notice dated Jan. 10, 2022 in Korean Patent Application No. 10-2020-7027252 (with English translation), 8 pages.
Combined Chinese Office Action and Search Report dated Feb. 10, 2023 in Patent Application No. 201980005896.3 (with partial English translation), 9 pages.
International Search Report and Written Opinion dated Sep. 10, 2019 in PCT/JP2019/023868 (with English translation of the Written Opinion), 14 pages.
Shouzo Fujimoto et al, "Film Extrusion of Linear Low Density Polyethylene (L-LDPE)", Toyo Soda Research Report, vol. 27, No. 2, 1983, pp. 87-98 (with English abstract).

* cited by examiner

*Primary Examiner* — Chanceity N Robinson
*Assistant Examiner* — Anna Malloy
(74) *Attorney, Agent, or Firm* — Element IP, PLC

(57) ABSTRACT

A cover film for dry film resist, includes a polyethylene film including a first mixture of high pressure low density polyethylene (LDPE) and linear low density polyethylene (LLDPE). The first mixture has an LDPE to LLDPE ratio by mass of from 90:10 to 60:40. The polyethylene film is free of a plasticizer, anti-blocking agent, slipping agent, and anti-static agent. The number of fish eyes having a minimum diameter of 0.2 mm or greater present in 100 m$^2$ of the 19 μm thick cover film in plan view is at most two. The polyethylene film has a thickness of from 10 to 20 μm and a haze value of from 12 to 25%.

20 Claims, No Drawings

POLYETHYLENE FILM AND DRY FILM RESIST

TECHNICAL FIELD

The present invention relates to a polyethylene film and a dry film resist using the polyethylene film as a cover film for the dry film resist.

Background Art

Dry film resists (DFRs) are used to manufacture circuit boards that are mounted in computers or smart phones. DFRs need to have a cover film that forms a surface to protect and cover the resist layer (=photosensitive resin layer) of the DFRs because the resist layer is sticky. The use of a polyester-based film for such cover films has been investigated in an attempt to produce a more flexible and cost effective film. A polyethylene mixed composition has been proposed in Japanese Patent No. 6068463 (Patent Literature 1) as a technology relating to a polyethylene-based film.

Citation List
Patent Literature
PTL 1: Japanese Patent No. 6068463
Summary of Invention
Technical Problem However, a polyethylene-based film made from molten resin pellets, which is not broken (film breakage) and free of holes or fish-eyes, is required to respond to the need for less expensive and thinner film as the cover film for DFRs.

Solution to Problem

The present invention has the following configurations to solve the problems mentioned above.

(1) A polyethylene film is characterized by containing a mixture of a high pressure, low density polyethylene (LDPE) and a linear low-density polyethylene (LLDPE) with a mixing ratio (mass percent) of the LDPE to the LLDPE of from 90:10 to 60:40, wherein fish eyes having a minimum diameter of 0.2 mm or greater present in 100 m$^2$ of the 19 μm thick cover film in plan view are at most two, wherein the polyethylene film has a thickness of from 10 to 20 μm and a haze value of 12 to 25 percent.

(2) The polyethylene film mentioned above, wherein the mixing ratio is in a range of from 80:20 to 70:30.

(3) The polyethylene film mentioned above, wherein the polyethylene film has a density of from 0.910 to 0.928 g/cm$^3$.

(4) The polyethylene film mentioned above characterized in that the polyethylene film is a two-layered film including a polyethylene film layer containing the mixture with a mixing ratio (mass percent) of the mixture of the LDPE: the LLDPE is in a range of from 90:10 to 60:40 and a polyethylene film layer containing the mixture with a mixing ratio (mass percent) of the mixture of the LDPE: the LLDPE is in a range of from 100:0 to 80:20, wherein fish eyes having a minimum diameter of 0.2 mm or greater present in 100 m$^2$ of the 19 μm thick cover film in plan view are at most two, wherein the polyethylene film has a thickness of from 10 to 20 μm, and a haze value of from 12 to 25 percent.

(5) The polyethylene film mentioned above, wherein the polyethylene film is a three-layered film selected from any combinations of the polyethylene film layer containing the mixture with a mixing ratio (mass percent) of the mixture of the LDPE: the LLDPE is in a range of from 90:10 to 60:40 and the polyethylene film layer containing the mixture with a mixing ratio (mass percent) of the mixture of the LDPE: the LLDPE is in a range of from 100:0 to 80:20.

(6) The polyethylene film mentioned above, wherein the polyethylene film layer containing the mixture of the LDPE and the LLDPE with a mixing ratio (mass percent) of the LDPE to the LLDPE of from 100:0 to 80:20 is layered on both of the top surface and the bottom surface of the polyethylene film layer containing the mixture of the LDPE and the LLDPE with a mixing ratio (mass percent) of the LDPE to the LLDPE of from 90:10 to 60:40.

(7) The polyethylene film mentioned above, wherein the polyethylene film layer containing the mixture of the LDPE and the LLDPE with a mixing ratio (mass percent) of the LDPE to the LLDPE of from 90:10 to 60:40 is layered on both of the top surface and the bottom surface of the polyethylene film layer containing the mixture of the LDPE and the LLDPE with a mixing ratio (mass percent) of the LDPE to the LLDPE of from 100:0 to 80:20.

(8) A dry film resist contains a resist layer and any one of the polyethylene films mentioned above layered on the resist layer as a cover film.

(9) A dry film resist contains a resist layer and any one of the polyethylene films mentioned above layered on the resist layer as a cover film, wherein the polyethylene film layer of the mixture of the LDPE and the LLDPE with a mixing ratio (mass percent) of the LDPE to the LLDPE of from 90:10 to 60:40 faces the resist layer.

Advantageous Effects of Invention

The polyethylene film of the present invention and the cover film for dry film resist using this polyethylene film are not readily breakable (broken film), free of holes, and minimizes happoccurrence of fish eyes.

The dry film resist of the present invention suitably covers the resist layer of the dry film resist and has good workability so that it can be readily peeled off.

DESCRIPTION OF EMBODIMENTS

The present invention is described in detail referring to several embodiments. The same descriptions for materials, compositions, manufacturing methods, actions, effects, etc., in each embodiment are omitted.

First Embodiment:

In the first embodiment of the present invention, the polyethylene film contains a mixture of a high pressure low density polyethylene (LDPE) (hereinafter also referred to as low density polyethylene) and a linear low density polyethylene (LLDPE) (hereinafter also referred to as linear polyethylene), the LDPE having a density of from 0.910 to 0.930 g/cm$^3$ and the LLDPE having a density of from 0.910 to 0.925 g/cm$^3$, wherein the mixing ratio (mass percent) of the LDPE to the LLDPE is from 90:10 to 70:30, wherein fish eyes having a minimum diameter of 0.2 mm or greater present in 100 m$^2$ of the 19 μm thick cover film in plan view are at most two, wherein the polyethylene film has a haze value of from 12 to 25 percent with a thickness of from 10 to 20 μm.

"in plan view" means seeing the wide surface of a polyethylene film from the perpendicular direction (i.e., thickness direction). Because fish eyes tend to occur in a shape such as an elliptical shape in plan view, the size of the fish eyes is defined by the minimal diameter for clarity. The minimal diameter of an ellipsoidal fish eye is the length of the minor axis. The unit of the area where the fish eyes are counted is 100 m$^2$ of the 19 μm thick cover film because the number of fish eyes depends on both the size of the unit of area and the thickness of a polyethylene film in plan view and is based on the number per 100 m$^2$ of a film having a thickness of 19 μm.

The mixing ratio of the LLDPE in the mixture of the LDPE and the LLDPE is from 10 to 40 mass percent and preferably from 20 to 30 mass percent. It is difficult to produce a polyethylene film having a thickness of 10 μm with a mixture of the LDPE and the LLDPE with a mixing ratio of the LLDPE below 10 mass percent. Conversely, a mixture of the LDPE and the LLDPE with a mixing ratio of the linear polyethylene above 40 mass percent increases occurrence of fish eyes and lowers the haze value so that reeling polyethylene film is difficult in manufacturing. In addition, productivity deteriorates, resulting in cost increase. A mixing ratio lower than 20 mass percent readily results in many holes. A mixing ratio is greater than 30 mass percent tends to increase the number of fish eyes present in a film.

Polyethylene film in which 10 or less fish eyes having a minimal diameter of 0.2 mm or greater are present in 100 $m^2$ of the 19 μm thick cover film in plan view is satisfying as a cover film for DFR. However, as the fish eyes increases, the resist layer around the portions of the fish eyes does not readily adhere to the film. This weak adhesion causes problems so that the number of the fish eyes present in 100 $m^2$ of the 19 μm thick cover film in plan view should be two or less, preferably one or less in 100 $m^2$ of the 19 μm thick cover film in plan view, and more preferably 0.5 in 100 $m^2$ of the 19 μm thick cover film in plan view. Fish eye means a small block-like portion present in a flat film. Poor mixing and/or melting is inferred to cause fish eyes.

Haze indicates the degree of transparency of polyethylene film and suitability for DFRs. The haze value is from 12 to 25% and preferably from 15 to 20%. When the haze value is greater than 25%, attachability of the polyethylene film with the resist layer deteriorates so that the polyethylene film readily peels off when used as a cover film for DFRs. Conversely, when the haze value is less than 12%, the polyethylene film becomes flat, which degrades slippery resistance. If the surface is flat, air is readily taken in when polyethylene film is reeled during manufacturing. This air taken-in readily causes spikes on the surface of the film. A haze value of 20% or less enhances attachability against a resist layer. The haze value of polyethylene film is measured with a haze meter (trade name: NDH 400, manufactured by NIPPPON DENSHOKU INDUSTRIES CO., LTD.) according to JISK 7136 format.

The thickness of the polyethylene film is preferably from 10 to 20 μm. A polyethylene film having a thickness of not greater than 10 μm readily breaks. Conversely, a polyethylene film having a thickness of not less than 20 μm is expensive and increases the volume of DFR film roll, degrading ease of handling and the difference in the thickness of the film tends to increase. The difference in the thickness is preferably 6 μm or less and more preferably 4 μm or less in the range of the desirable thickness of the polyethylene film, which is from 10 to 20 μm. When the difference in the thickness is greater than 6 μm for the range of the desirable thickness, the film may wrinkle after the film is reeled and the photoresist material may ooze from the wrinkles. The difference in the thickness refers to the difference between the thickest part of the film and the thinnest part thereof.

The melt flow rate (MFR) of the polyethylene film is preferably from 1.0 to 10 g/10 min. The MFR is measured under a load of 2.16 kg at 190 degrees C. according to JIS K7210 format. An MFR less than 1.0 g/10 min degrades fluidity during molding by an inflation or T-die method, which makes molding difficult. An MFR greater than 10 g/10 min may destabilize the inflation tube during molding by inflation.

The polyethylene preferably has a density of from 0.910 to 0.928 $g/cm^3$. When the density of the polyethylene film is lower than 0.910 $g/cm^3$, the polyethylene film loses robustness so that the film tends to be twisted and wrinkled during manufacturing the polyethylene film. The polyethylene film also tends to be twisted and wrinkled during manufacturing a DFR. The inflation tube may be destabilized during inflation molding and overlapped tubes adhere to each other, resulting in blocking. A polyethylene film having a density greater than 0.928 $g/cm^3$ may produce powder on the surface of the polyethylene film.

Polyethylene film can be manufactured by an inflation or T-die method. The obtained polyethylene film can be used as a cover film suitable for DFR. The polyethylene film layers firmly onto the resist layer of the DFR and can be readily peeled away when the dry film is used. Because the polyethylene film is thin, DFR having a resist layer covered with this thin polyethylene film can be stored in a roll that takes less space than a roll of DFR having a resist layer covered with a thick polyethylene film.

This polyethylene film is basically obtained as a monopolymer of ethylene of LDPE and LLDPE. The copolymer component such as an α-olefin monomer and non-olefin monomer is limited to 5 mol% or less and, in addition, the polyethylene film is safe and stable because the polyethylene film is molded without containing a plasticizer, anti-blocking agent, slipping agent, and charge inhibitor. However, the additives mentioned above may be optionally added to suit to a particular application other than DFR.

Second Embodiment:

The polyethylene film of the present embodiment is manufactured with the same materials in the same methods as mentioned in the First Embodiment and includes layers while the polyethylene film of the First Embodiment is single-layered.

Embodiment 2-1:

The polyethylene film is three layered and manufactured by co-extrusion. The proportion of the LLDPE material is higher in both surface layers than in the center layer. It is preferable that the proportion of the LLDPE in the mixture of the LDPE and LLDPE in the center layer be from 0 to 20% by mass and the proportion of the LLDPE in the mixture of the LDPE and LLDPE in the outer layers be from 10 to 40% by mass. The proportion of the LLDPE in both of the outer layers may be the same but is not necessarily the same.

One structure of the layered polyethylene film includes a center layer of the polyethylene film made of LDPE free of LLDPE and two outer layers covering the center layer made of the polyethylene film containing LLDPE in an amount of 20% by mass. The surface layers containing LLDPE prevent this layered polyethylene film from getting a hole, thereby achieving good film strength. Moreover, the center layer having a minimal amount of LLDPE decreases occurrence of fish eyes.

The three-layer polyethylene film of the present embodiment preferably has a thickness of from 10 to 20 μm in total. The three layers may have an equal thickness but preferably have a center layer as the base of the entire polyethylene film thicker than the outer layers to compensate the defects of the center layer by the outer surfaces. It is preferable to form a three-layer polyethylene film having a thickness of 10 μm or greater to securely mold each layer. Conversely, it is possible to manufacture a polyethylene film having a thickness greater than 20 μm, however, a thin polyethylene film is preferable to save the cost. A thickness of 20 μm is satisfying.

Embodiment 2-2:

The polyethylene film of the present embodiment also has a three layer structure manufactured by co-extrusion with outer surface layers made of materials having a smaller proportion of the LLDPE than the center layer. The proportion of the LLDPE material is lower in both surface layers than in the center layer. It is preferable that the proportion of the LLDPE in the mixture of the LDPE and LLDPE in the center layer be from 10 to 40% by mass and the proportion of the LLDPE in the mixture of the LDPE and LLDPE in the outer layers be from 0 to 20% by mass. The proportion of the LLDPE in both of the outer layers may be the same but is not necessarily the same.

One structure of the layered polyethylene film includes a center layer of polyethylene film made of the LDPE with the LLDPE in an amount of 20% by mass and two outer layers covering the center layer made of the film containing the LDPE alone free of the LLDPE (0%). The surface layers containing a minimal amount of the LLDPE reduce fish eyes appearing in the surface and prevents the polyethylene film from wrinkling during reeling the polyethylene film. The center layer containing a large amount of the LDPE enhances the film strength of the film, which prevents occurrence of undesirable holes.

It is preferable to have a total thickness of the polyethylene film of the present embodiment of from 10 to 20 μm. The three layers may have an equal thickness but preferably have a center layer as the base of the entire polyethylene film thicker than the outer layers to compensate the defects of the center layer by the outer surfaces. It is preferable to form a three-layer polyethylene film having a thickness of 10 μm or greater to securely mold each layer. Conversely, it is possible to manufacture a polyethylene film having a thickness greater than 20 μm, however, a thin polyethylene film is preferable to save the cost. A thickness of 20 μm is satisfying.

Variation Example:

The laminate polyethylene film is not limited to a three-layered film and may have a two or four or more layer structure. In the case of the two layered film having one layer containing LLDPE in a more amount than the other, the film strength can also be enhanced and the entire number of fish eyes can be decreased by reducing the amount of LLDPE in the other layer, which increases productivity.

Layered polyethylene film can be manufactured by stacking films by co-extrusion utilizing an inflation or T-die method like the case of the single layer polyethylene film. The laminate polyethylene film can also be used as a cover film suitable for a dry film resist.

It is preferable to face a layered polyethylene film having a proportion of the LLDPE in an amount of from 10 to 40% by mass with the resist layer to use the layered polyethylene film as the cover film for DFR. This is because the polyethylene film layer containing LLDPE in a proportion of from 10 to 40% has a haze of from 10 to 25% and readily covers the resist layer during manufacturing and the cover film can be readily peeled away when the DFR is used.

The layered polyethylene film used as a cover film for DFR firmly layers onto the resist layer of the DFR and can be readily peeled away when the DFR is used. In addition, because the polyethylene film is thin, DFR having a resist layer covered with this thin polyethylene film can be stored in a roll that takes less space than a roll of DFR having a resist layer covered with a thick polyethylene film.

EXAMPLES

Experiment 1:

A certain amount of LLDPE having a density of 0.918 g/cm$^3$ and a melt flow rate (MFR) of 3.8 was mixed as a blend material with an LDPE having a density of 0.923 g/cm$^3$ and an MFR of 3.6 as a base material. The resulting mixture as the material resin free of other polymer components, a plastic agent, anti-blocking agent, slipping agent, and anti-static agent was melt-kneaded at 150 to 170° C. with an inflation film forming machine to manufacture a polyethylene film having a width of 1,265 mm and a certain thickness.

The thicknesses of the manufactured polyethylene films were 10 μm, 13 μm, and 15 μm. The proportions of the LLDPE in the total amount (100% by mass) of the LDPE and the LLDPE were 0% by mass, 5% by mass, 10% by mass, 20% by mass, 30% by mass, 40% by mass, 50% by mass, and 90% by mass. These samples were numbered as the sample 1-1 to 8-3 as shown in Table 1.

The number of holes, number of fish eyes (FE number), difference in thickness, and transparency (haze) of the polyethylene film of the obtained samples are shown in Table 1. The amount of the polyethylene discharged as an aspect of the productivity of manufacturing and the comprehensive evaluation are also shown in Table 1.

The number of holes, FE number, and difference in thickness were measured by a surface detector (manufactured by FUTEC INC.) under the following conditions:

0.103 mm/pixel in the width direction of polyethylene film
0.138 mm/scan
Transparency method.

The difference in thickness was determined as the difference between the maximum thickness and the minimum thickness with a measuring interval of 25 mm in the measuring results.

The evaluation for each measuring result is as follows.

The number of holes in a region of the polyethylene film of a width of 1,265 mm and a length of 4,000 mm is shown. The polyethylene film was graded as A (excellent) when the number of holes was zero. The polyethylene film was graded as B (good) when the number of holes was one. The polyethylene film was graded as C (poor) when the number of holes was two or more or the polyethylene film broke. The polyethylene film was graded as A (excellent) when the number of fish eyes was less than 1.0 per 100 m$^2$ of the 19 μm thick cover film in plan view. The polyethylene film was graded as B (good) when the number of fish eyes was 1.0 to 2.0 per 100 m$^2$ of the 19 μm thick cover film in plan view. The polyethylene film was graded as C (poor) when the number of fish eyes was greater than 2.0 per 100 m$^2$ of the 19 μm thick cover film in plan view. The polyethylene film was graded as A (excellent) when the difference in thickness was less than 2.5 μm. The polyethylene film was graded as B (good) when the difference in thickness was from 2.5 to 3.5 μm. The polyethylene film was graded as C (poor) when the difference in thickness was greater than 3.5 μm. The transparency was determined by haze and graded as A (excellent) when the haze was from 15 to 20. The transparency was graded as B (good) when the haze was from greater than 20 to 25 and from 12 to less than 15. The transparency was graded as C (poor) when the haze was less than 12 or greater than 25.

The amount discharged is represented by the ratio (% by mass) of the amount discharged when the amount of polyethylene film free of LLDPE (meaning made of LDPE alone) discharged from a molding machine is 100%. The amount discharged was graded as S (most preferable), A (preferable), B (fair, tolerable from a view point of industrial production), and C (poor, unsuitable for practical use). The samples were comprehensively evaluated based on all of the number of holes (whether the film broke), FE number, difference in thickness, transparency, and amount discharged and graded as S (most preferable), A (preferable), B (fair, tolerable from a view point of industrial production), and C (poor, unsuitable for practical use).

The sample was graded as "broken" when the polyethylene film broke during manufacturing. The evaluations of such samples were cancelled except for the number of holes because they failed to reach the stage of evaluation.

increased too much to produce a uniform polyethylene film. When it comes to the transparency based on the haze value, some of the polyethylene film had a haze value of less than 12% at a mixing ratio of LLDPE of 90% by mass. Polyethylene film having this degree of transparency tends to take in air during reeling the film in manufacturing, which is inferred to be reslt in a bumpy surface.

The ratio of the amount discharged decreased as the mixing ratio of the LLDPE increased. It was found that the mixing ratio of the LLDPE was preferably not greater than

TABLE 1

| Sample No. | LDPE:LLDPE (% by mass) | Thickness (μm) | Number of holes (Holes/unit of area) | | FE number (fish eyes/1.9 m²) | | Difference in thickness (μm) | | Transparency (Haze) (%) | | ratio of the amount discharged (% by mass) | | Comprehensive evaluation |
|---|---|---|---|---|---|---|---|---|---|---|---|---|---|
| | | | | Grade | | Grade | | Grade | | Grade | | Grade | |
| 1-1 | 100:0 | 15 | 3 | C | 0.15 | A | 1.8 | A | 19 | A | 100 | S | C |
| 1-2 | | 13 | 4 | C | 0.1 | A | 2 | A | 21 | B | | | |
| 1-3 | | 10 | broken | C | broken | — | broken | — | broken | — | | | |
| 2-1 | 95:5 | 15 | 1 | B | 0.39 | A | 2.2 | A | 19 | A | 96 | S | C |
| 2-2 | | 13 | 1 | B | 0.32 | A | 1.9 | A | 21 | B | | | |
| 2-3 | | 10 | broken | C | broken | — | broken | — | broken | — | | | |
| 3-1 | 90:10 | 15 | 0 | A | 0.35 | A | 2.1 | A | 19 | A | 88 | A | A |
| 3-2 | | 13 | 1 | B | 0.33 | A | 1.6 | A | 21 | B | | | |
| 3-3 | | 10 | 1 | B | 0.32 | A | 1.6 | A | 21 | B | | | |
| 4-1 | 80:20 | 15 | 0 | A | 0.83 | A | 2.3 | A | 18 | A | 88 | A | S |
| 4-2 | | 13 | 0 | A | 1 | B | 1.7 | A | 17 | A | | | |
| 4.3 | | 10 | 0 | A | 1.01 | B | 1.5 | A | 20 | A | | | |
| 5-1 | 70:30 | 15 | 0 | A | 1.25 | B | 2.2 | A | 18 | A | 76 | A | S |
| 5-2 | | 13 | 0 | A | 1.19 | B | 2.1 | A | 18 | A | | | |
| 5-3 | | 10 | 0 | A | 1.21 | B | 2.1 | A | 19 | A | | | |
| 6-1 | 60:40 | 15 | 0 | A | 1.43 | B | 2.5 | B | 16 | A | 63 | B | A |
| 6-2 | | 13 | 0 | A | 1.37 | B | 2.3 | A | 17 | A | | | |
| 6-3 | | 10 | 0 | A | 1.32 | B | 2.4 | A | 16 | A | | | |
| 7-1 | 50:50 | 15 | 0 | A | 1.71 | B | 2.5 | B | 14 | B | 42 | C | C |
| 7-2 | | 13 | 0 | A | 1.53 | B | 2.7 | B | 14 | B | | | |
| 7-3 | | 10 | 0 | A | 2.85 | C | 2.6 | B | 14 | B | | | |
| 8-1 | 10:90 | 15 | 0 | A | 3.59 | C | 3.4 | B | 11 | C | 25 | C | C |
| 8-2 | | 13 | 0 | A | 3.42 | C | 2.8 | B | 11 | C | | | |
| 8-3 | | 10 | 0 | A | 3.37 | C | 2.7 | B | 12 | B | | | |

The samples 1 (samples 1-1 to 1-3) and samples 2 (samples 2-1 to 2-3), all having a mixing ratio of the LLDPE of 5% by mass or less, broke when the polyethylene film was as thin as 10 μm but did not break when the mixing ratio of the LLDPE was 10% by mass or more. This indicates that the mixing ratio of the LLDPE is required to be not less than 10% by mass to produce a polyethylene film having a thickness as thin as 10 μm. However, when the mixing ratio of the LLDPE was less than 10% by mass, holes appeared regardless of the thickness of the film. This indicates that the mixing ratio of the LLDPE should be at least 10% by mass and preferably at least 20% by mass.

The FE number was 0.5/100 m² of the 19 μm thick cover film in plan view or less up to the mixing ratio of the LLDPE of 10% by mass and was from 0.5/100 m² of the 19 μm thick cover film in plan view to 2.0/100 m² of the 19 μm thick cover film in plan view at 20 to 40% by mass. Some of the polyethylene films had more than 2.0/100 m² of the 19 μm thick cover film in plan view at 50% by mass or greater. This indicates that, as the mixing ratio of LLDPE increases, FE number increases so that the mixing ratio of LLDPE should be 40% by mass or less in terms of FR number.

Regarding the difference in thickness, when the mixing ratio of the LLDPE was 50% by mass or greater, the difference in the thickness of a thin polyethylene film 30% by mass, acceptable up to 40% by mass, and not acceptable when the mixing ratio surpasses 50% by mass.

The comprehensive analysis on the results indicates that the mixing ratio of the LLDPE is preferably from 10 to 40% by mass and more preferably from 20 to 30% by mass when the LLDPE and the LDPE make 100% by mass in total.

Experiment 2:

A polyethylene film having the same size as the polyethylene film of Example 1 was manufactured using the same materials in the same manner as in Example 1 except that the thickness of each film layer was 5 μm and the total thickness of the three layer film was 15 μm. The results were shown in Table 2. The layered polyethylene film as the sample 12 had two outer polyethylene film layers as the surfaces free of LLDPE and the center layer between the two outer polyethylene film layers, which contained the LLDPE in an amount of 20% by mass. The sample 13 had a structure the other way round to the sample 12, which had two outer polyethylene film layers as the surfaces containing the LLDPE in an amount of 20% by mass and the center layer free of the LLDPE, each layer had a thickness of 5 μm. The polyethylene films of the sample 1-1 and the sample 4-1 manufactured in Experiment 1 are also shown in Table 2 for comparison.

TABLE 2

| Sample No. | LDPE:LLDPE (% by mass) | Thickness (μm) | Number of holes (Holes/unit of area) | | FE number (fish eyes/1.9 m$^2$) | | Difference in thickness (μm) | | Transparency (Haze) (%) | | ratio of the amount discharged (% by mass) | | Comprehensive evaluation |
|---|---|---|---|---|---|---|---|---|---|---|---|---|---|
| | | | | Grade | | Grade | | Grade | | Grade | | Grade | |
| 1-1 | 100:0 | 15 | 3 | C | 0.15 | A | 1.8 | A | 19 | A | 100 | S | C |
| 12 | 100:0<br>80:20<br>100:0 | 5<br>5<br>5 | 0 | A | 0.31 | A | 2.2 | A | 19 | A | 100 | S | S |
| 13 | 80:20<br>100:0<br>80:20 | 5<br>5<br>5 | 0 | A | 0.47 | A | 2.3 | A | 18 | A | 94 | A | A |
| 4-1 | 80:20 | 15 | 0 | A | 0.83 | A | 2.3 | A | 18 | A | 88 | A | A |

As seen in these results, the layered film has such merits. That is, this layered film compensated the respective defects of the single-layer film (sample 1-1) free of the LLDPE and the single-layer film (sample 4-1) containing the LLDPE in an amount of 20% by mass. The sample 12 and the sample 13 in which the film layer free of the LLDPE layered on the film layer containing the LLDPE in an amount of 20% by mass were graded higher than the sample 1-1 regarding the number of holes and as the same as the sample 4-1 regarding the FE number, but the actual FE number decreased in comparison with the sample 4-1. Before the experiments, the layered film was expected to compensate holes appearing in a single layer film by the other layer but raised a concern about the FE number because the FE number of the single layer film was added. However, the fish eyes having a minimum diameter of 0.2 mm or greater did not appear as predicted in the layered structure. The sample 12 and the sample 13 were preferable to save the raw material cost because both contained a less amount of LLDPE in total than the sample 4-1. The number of holes, that represents the film strength, was significantly improved in the sample 12 and the sample 13 in spite that the amount of LLDPE was small. When it comes to the comparison between the sample 12 and the sample 13, the sample 12, which contained a more amount of the LLDPE in the intermediate layer, was better to improve the ratio of the amount discharged and the cost of the raw material.

The invention claimed is:

1. A cover film for dry film resist, comprising:
    a polyethylene film comprising three layers consisting of one layer A and two layers B, the layer A being positioned between the two layers B,
    wherein the layer A comprises a first mixture of high pressure low density polyethylene (LDPE) and linear low density polyethylene (LLDPE), the first mixture having an LDPE to LLDPE ratio by mass of 90:10 to 60:40,
    wherein the layer B comprises a second mixture of high pressure low density polyethylene (LDPE) and linear low density polyethylene (LLDPE), the second mixture having an LDPE to LLDPE ratio by mass of 100:0 to 80:20,
    wherein a content of the linear low density polyethylene (LLDPE) in the first mixture is higher than a content of the linear low density polyethylene (LLDPE) in the second mixture,
    wherein the polyethylene film is free of a plasticizer, anti-blocking agent, slipping agent, and anti-static agent,
    wherein the number of fish eyes having a minimum diameter of 0.2 mm or greater in the cover film in plan view is at most two based on the number per 100 m$^2$ of the cover film having a thickness of 19 μm, and
    wherein the polyethylene film has a thickness of 10 to 20 μm and a haze value of 12 to 25%.

2. The cover film for dry film resist according to claim 1, wherein the LDPE to LLDPE ratio in the first mixture is from 80:20 to 70:30.

3. The cover film for dry film resist according to claim 1, wherein the polyethylene film has a density of 0.910 to 0.928 g/cm$^3$.

4. A dry film resist comprising:
    a resist layer; and
    the cover film for dry film resist of claim 1, layered on the resist layer.

5. The cover film for dry film resist according to claim 1, wherein the number of fish eyes having a minimum diameter of 0.2 mm or greater in the cover film in plan view is at most one based on the number per 100 m$^2$ of the cover film having a thickness of 19 μm.

6. The cover film for dry film resist according to claim 1, wherein the number of fish eyes having a minimum diameter of 0.2 mm or greater in the cover film in plan view is at most 0.5 based on the number per 100 m$^2$ of the cover film having a thickness of 19 μm.

7. The cover film for dry film resist according to claim 1, wherein the polyethylene film has the haze value of 15 to 20%.

8. The cover film for dry film resist according to claim 1, wherein a difference between the thickness of the thickest part and the thickness of the thinnest part of the polyethylene film is 6 μm or less.

9. The cover film for dry film resist according to claim 1, wherein a difference between the thickness of the thickest part and the thickness of the thinnest part of the polyethylene film is 4 μm or less.

10. The cover film for dry film resist according to claim 1, wherein a melt flow rate of the polyethylene film is from 1.0 to 10 g/10 min.

11. The cover film for dry film resist according to claim 1, wherein the layer A is thicker than the layer B.

12. The dry film resist according to claim 4, wherein the LDPE to LLDPE ratio in the first mixture is from 80:20 to 70:30.

13. The dry film resist according to claim 4, wherein the polyethylene film has a density of 0.910 to 0.928 g/cm$^3$.

14. The dry film resist according to claim 4, wherein the number of fish eyes having a minimum diameter of 0.2 mm or greater in the cover film in plan view is at most one based on the number per 100 m² of the cover film having a thickness of 19 μm.

15. The dry film resist according to claim 4, wherein the number of fish eyes having a minimum diameter of 0.2 mm or greater in the cover film in plan view is at most 0.5 based on the number per 100 m² of the cover film having a thickness of 19 μm.

16. The dry film resist according to claim 4, wherein the polyethylene film has the haze value of 15 to 20%.

17. The dry film resist according to claim 4, wherein a difference between the thickness of the thickest part and the thickness of the thinnest part of the polyethylene film is 6 μm or less.

18. The dry film resist according to claim 4, wherein a difference between the thickness of the thickest part and the thickness of the thinnest part of the polyethylene film is 4 μm or less.

19. The dry film resist according to claim 4, wherein a melt flow rate of the polyethylene film is from 1.0 to 10 g/10 min.

20. The dry film resist according to claim 4, wherein the layer A is thicker than the layer B.

\* \* \* \* \*